US006992543B2

(12) United States Patent
Luetzelschwab et al.

(10) Patent No.: US 6,992,543 B2
(45) Date of Patent: Jan. 31, 2006

(54) MEMS-TUNED HIGH POWER, HIGH EFFICIENCY, WIDE BANDWIDTH POWER AMPLIFIER

(75) Inventors: Roland C. Luetzelschwab, Ft. Wayne, IN (US); Robert D. Streeter, Ft. Wayne, IN (US); Lee A. McMillan, Ft. Wayne, IN (US)

(73) Assignee: Raytheon Company, Waltham, MA (US)

( * ) Notice: Subject to any disclaimer, the term of this patent is extended or adjusted under 35 U.S.C. 154(b) by 84 days.

(21) Appl. No.: 10/302,482

(22) Filed: Nov. 22, 2002

(65) Prior Publication Data
US 2004/0100341 A1    May 27, 2004

(51) Int. Cl.
H03H 7/38    (2006.01)
(52) U.S. Cl. .................. 333/32; 333/17.3; 330/195; 330/197
(58) Field of Classification Search .................. 333/32, 333/17.3; 330/195, 197
See application file for complete search history.

(56) References Cited

U.S. PATENT DOCUMENTS

| 3,713,006 | A | | 1/1973 | Litty et al. .................. 257/584 |
| 5,276,912 | A | | 1/1994 | Siwiak et al. ................. 455/73 |
| 5,808,527 | A | * | 9/1998 | De Los Santos ............ 333/205 |
| 5,872,489 | A | * | 2/1999 | Chang et al. ................ 331/179 |
| 5,880,921 | A | | 3/1999 | Tham et al. ................. 361/233 |
| 6,188,291 | B1 | * | 2/2001 | Gopinathan et al. .......... 331/45 |
| 6,232,841 | B1 | | 5/2001 | Bartlett et al. .............. 330/305 |
| 6,236,274 | B1 | | 5/2001 | Liu ............................ 330/302 |
| 6,252,354 | B1 | * | 6/2001 | Collins et al. ........... 315/111.51 |
| 6,677,828 | B1 | * | 1/2004 | Harnett et al. ............. 333/17.3 |

OTHER PUBLICATIONS

R. D. Streeter, C. A. Hall, R. Wood, R. Mahadevan, "VHF High Power Tunable RF Bandpass Filter using Microelectromechanical (MEM) Microrelays", *International Journal of RF and Microwave Computer-Aided Engineering*, vol. 11/No. 5, Sep. 2001, pp. 261-275.
F. H. Raab, An Introduction to Class-F Power Amplifiers, *RF Design*, May, 1996, pp. 79-84.
R. Hejhall, "Systemizing RF Power Amplifier Design" AN-282A Application Note, *MOTOROLA Semiconductor Products Inc.*, © Motorola Inc., 1972.

* cited by examiner

*Primary Examiner*—Stephen E. Jones
(74) *Attorney, Agent, or Firm*—Daly, Crowley, Mofford & Durkee, LLP

(57) ABSTRACT

A circuit for matching the impedance of an output load to an active device includes a transformer including a first winding having a terminal for coupling to the output of the active device and a second winding electromagnetically coupled to the first winding, and a plurality of taps, each of the plurality of taps having a first end coupled to a position on the second winding corresponding to a ratio of the second winding to first winding differing from other ones of the plurality of taps, and a second end. The matching circuit further includes a plurality of MEMS switches each having a control input for receiving a corresponding control signal, a first terminal coupled to the second end of a corresponding one of the plurality of taps, and a switched output selectively coupled to a matching junction in response to the corresponding control signal.

23 Claims, 9 Drawing Sheets

MEMS-TUNED HIGH POWER, HIGH EFFICIENCY, WIDE BANDWIDTH POWER AMPLIFIER

CROSS-REFERENCE TO RELATED APPLICATIONS

Not applicable.

STATEMENTS REGARDING FEDERALLY SPONSORED RESEARCH

Not applicable.

FIELD OF THE INVENTION

This invention relates generally to tuned radio frequency power amplifiers, high power high efficiency power amplifiers, and more particularly to tunable high power high efficiency power amplifiers.

BACKGROUND OF THE INVENTION

In wireless radio frequency (RF) communications and radar applications, it is often desirable to provide power amplifiers having high power over a wide frequency range. Transistor power amplifiers operating at high output power over wide instantaneous bandwidths typically tradeoff efficiency (RF power output divided by DC power input) for acceptable power output and gain performance across a predetermined frequency range. This tradeoff is required because the optimum load impedance for the output transistor is not presented to the transistor at each frequency within the operating range. Instead, a load impedance (also referred to as a broadband match) is presented to the output transistor to give acceptable, but less than optimum, performance across the entire intended frequency range.

Known RF systems have operated with less than desired performance in power amplifier efficiency across the operating frequency range. In these systems, the thermal capacity of the power amplifier is designed to handle the waste heat resulting from the amplifier inefficiencies. Some systems operating over relatively narrow bandwidths use impedance matching techniques to improve power amplifier efficiency at high output powers.

Increasing power amplifier efficiency over wide bandwidths has been improved using microelectromechanical systems (MEMS) RF switches to select matching components. An example of using MEMS RF switches to tune a power amplifier having relatively low output power over a range of frequencies is described in U.S. Pat. No. 6,232,841, entitled "Integrated Tunable High Efficiency power Amplifier," issued May 15, 2001. Additionally, many power amplifiers are utilized in frequency hopping systems (i.e., systems in which the carrier frequency changes on a periodic basis). Frequency hopping occurs at relatively high speeds, requiring that the MEMS switches that select the proper impedance matching components be capable of operating reliably for extended periods at these relatively high switching speeds.

For applications requiring relatively high power output (e.g., desired output power of about fifty watts) and a wide (30–400 MHz) frequency range, for example, power amplifiers for military communications systems, several design parameters must be resolved. For example, the relatively large number of MEMS RF switches and matching elements needed to provide a very wide frequency range and the resulting physical space requirements which conflict with good RF design practices at high frequencies must be addressed. The proper placement of MEMS RF switches and matching elements in the output matching circuitry where impedance levels are very low due to the high output power level must also be addressed. Furthermore, these components must survive high current levels (due to high RF power at low impedance levels) and must have a very high Q so as not to degrade the optimum efficiency and negate the advantage of tuning the power amplifier. In a frequency hopping communications system, the number of cycles experienced by a MEMS RF switch should not exceed the MEMS switch life cycle limits, where a different matching solution is selected for each subsequent hop requiring a state change for several of the MEMS RF switches. If the hop rate is fast enough (as in a military jam-resistant communications system), the MEMS RF switches will be cycled many times per second. Typical mission profiles indicate that each of the MEMS RF switches could experience $10^{12}$ cycles. The accumulated number of cycles can be several orders of magnitude greater than the life cycle rating of a MEMS RF switch which has a typical life cycle limit of approximately $10^9$ cycles. Furthermore, a configuration including a single point of failure, where a single MEMS RF switch failure severely impacts the performance of the power amplifier over the entire frequency range, must be avoided.

The importance of providing a matched load to the output transistor for optimum efficiency has been recognized in the past by those of ordinary skill in the art of power amplifier design, but implementing an actual matching circuit approaching a matched load over a wide frequency range at high output power levels has been relatively difficult to achieve. It would, therefore, be desirable to provide a matching circuit for reliably achieving high efficiency and high output power over a relatively wide frequency range. It would be further desirable to present the proper impedance to an output transistor across the entire desired frequency range, with reduced switching of additional matching elements, to locate MEMS RF switches and associated capacitors and inductors used for optimization in the circuit where these components are minimally stressed, and to prevent a catastrophic failure of the RF power amplifier system when a MEMS RF switch failure occurs.

SUMMARY OF THE INVENTION

In accordance with the present invention, a circuit for matching the impedance of an output load to an active device includes a transformer including a first winding having a terminal for coupling to the output of the active device and a second winding electromagnetically coupled to the first winding, and a plurality of taps, each of the plurality of taps having a first end coupled to a position on the second winding corresponding to a ratio of the second winding to first winding differing from other ones of the plurality of taps, and a second end. The matching circuit further includes a plurality of MEMS switches each having a control input for receiving a corresponding control signal, a first terminal coupled to the second end of a corresponding one of the plurality of taps, and a switched output selectively coupled to a matching junction in response to the corresponding control signal.

With such an arrangement, an output matching circuit is provided which reliably achieves high efficiency and high output power over a relatively wide frequency range by providing a nearly optimal load impedance to the RF transistor(s) in the power amplifier at each frequency within the frequency range. Additionally with such an arrangement, the following features are provided: (1) improved output power, gain, and efficiency for frequency bands within a predetermined frequency range; (2) a transformer having selectable impedance transformation ratios (selected via MEMS switches) to present the nearly optimal load impedance to one or more RF transistor in the power amplifier; and (3) sufficiently wide instantaneous bandwidth in the matching circuit to avoid MEMS switching in the frequency hopping bands for resolving MEMS switch life cycle issues.

In accordance with a further aspect of the present invention, the matching circuit further includes a MEMS controllable reactive network coupled to the transformer output. The MEMS controllable reactive network includes a first plurality of MEMS selectable shunt capacitors coupled to the matching junction, a plurality of MEMS selectable series inductors coupled in series and having a first end coupled to the matching junction and a second end for coupling to a load, and a second plurality of MEMS selectable shunt capacitors coupled to the second end of the plurality of MEMS selectable series inductors. With such an arrangement, the efficiency of the matching circuit can be further improved. The transformer and MEMS switch selectable taps provides an impedance matching configuration to reduce current flow and related stress in the capacitors and inductors in the MEMS controllable reactive network and the MEMS switches of the network. Because of the the wide instantaneous bandwidth, the MEMS switch cycling is reduced in frequency hopping applications to address MEMS switch life cycle issues.

In accordance with a still further aspect of the present invention, an amplifier includes an active device having an input for receiving an RF signal and an output, a transformer having a first winding coupled to the active device output, and a second winding providing a transformer output, a plurality of transformer secondary winding taps each having a first end coupled to the second winding and each corresponding to a different ratio of the second winding to first winding; and a plurality of MEMS switches each coupled between a corresponding one of the plurality of transformer taps and a matching junction, and each MEMS switch having a control input for receiving a control signal for changing the impedance of the transformer in response to the control signal.

With such an arrangement, it is possible to achieve high drain efficiency (greater than 80%), at relatively high output power levels for the active device, over a very wide frequency range (e.g., almost four octaves) by providing the desired load impedance for the RF power amplifier. Such amplifier efficiencies provide advantages in size, weight, and power consumption for high power output power amplifiers used in portable equipment which is battery powered.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Figure 1:
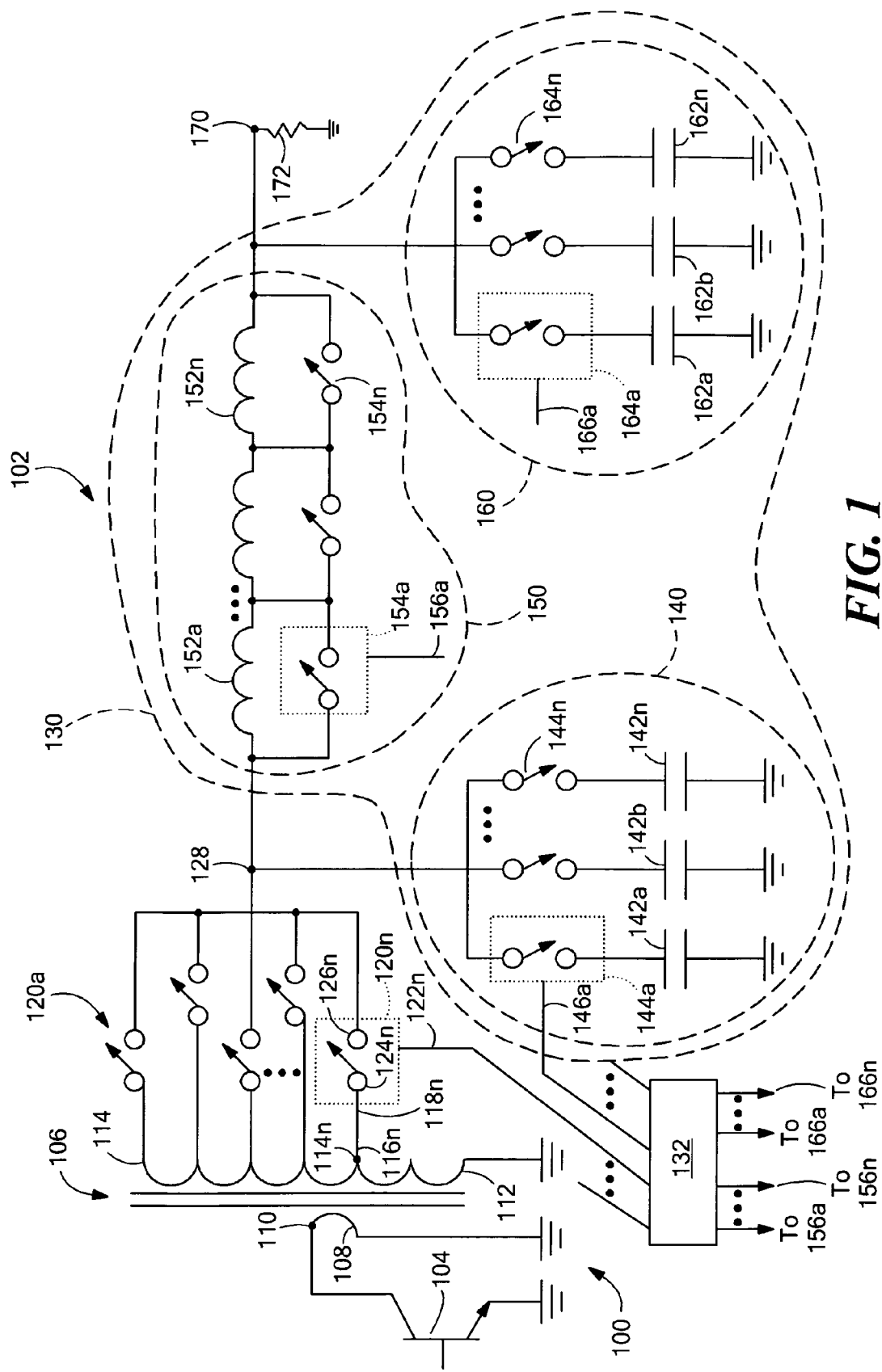
FIG. 1 is a schematic of a tuned power amplifier according to the invention.

Before providing a detailed description of the invention, it may be helpful to define some of the terms used in the description. As used herein, the term "MEMS RF switch" refers to a switch or relay operated by an electrostatic charge, thermal, piezoelectric or other actuation mechanism and manufactured using micro-electromechanical fabrication techniques. MEMS RF switches are usually single pole, single throw (SPST) configurations having a rest state that is normally open. In a relay, the RF signal circuit will be electrically isolated from the control circuit, whereas in a switch the circuits may be common.

The RF power transistor technologies used in conjunction with the inventive concepts described herein include, but are not limited to, bipolar junction transistors (BJTs), silicon metal oxide semiconductor field effect transistors (Si MOSFETs), laterally diffused metal oxide semiconductor field effect transistors (LDMOS FETs), gallium arsenide metal semiconductor field effect transistors (GaAs MESFETs), and silicon carbide MESFETs (SiC MESFETs). For a 30–400 MHz fifty watt high efficiency power amplifier, the choice of transistor technology favors LDMOS FETs and SiC MESFETs. Although fifty watt LDMOS FETs have slightly higher inherent efficiency due to a lower saturated drain-to-source resistance, fifty watt SiC MESFETs have potentially better broadband characteristics due to a lower drain-to-source capacitance and a higher operating voltage (Vdd).

As used herein, the term "active device" refers to one or more amplifier devices (generally semiconductor devices). The active device in an output matched amplifier includes but is not limited to a single high power transistor used in a single-ended circuit or two half-size (i.e., two active devices each having half the rated power of a single "full size" active device and operated in a push-pull configuration instead of the single device in a single-ended configuration) transistors used in a push-pull circuit. The push-pull topology offers better broadband capability due to higher impedances, but at the expense of needing additional input and output circuitry to provide the proper phase relationship between the two transistors. Other topologies include but are not limited to parallel configuration, cascode configurations and two push-pull stages combined to form one output.

As used herein the term "efficiency" generally refers to RF power output divided by DC power input. Efficiency is also referred to as "drain efficiency" when applied to field effect transistors (FETS) where DC power is going into the FET's drain. Similar measurements (i.e. RF output power divided by the total DC power) include plate efficiency (e.g., vacuum tubes have a plate, a cathode, and a grid), collector efficiency (e.g., BJTs have a collector, an emitter, and a base). Other types of efficiencies include power-added efficiency (PAE), total transmitter efficiency, amplitude modulated efficiency, etc. The inventive matching circuit generally boosts the respective amplifier efficiency measures. As used herein, "fundamental frequency" and "fundamental matching," as opposed to "harmonic frequency" and "harmonic matching," refer to the frequency at which it is desired to provide relatively greater amounts of output power.

Now referring to FIG. 1, a MEMS tuned power amplifier 100 includes matching circuit 102 for matching the impedance of an output load 172 to an active device 104, here a bipolar junction transistor. The matching circuit 102 includes a transformer 106 having a first winding 108 and a terminal 110 for coupling to the output of the active device 104, a second winding 112 having taps 114a–114n (generally referred to as tap 114), and a matching junction 128. Tap 114a refers to a position on the transformer generally referred to as the secondary winding output of the transformer 106.

Each tap 114 (with reference characters shown only for tap 114n for clarity) includes a first end 116n coupled to the secondary winding tap 114n and a second end 118n. The circuit 102 further includes MEMS RF switches 120a–120n (generally referred to as MEMS RF switches 120 and MEMS switches 120). Each of the MEMS RF switches 120 (with reference characters shown only for MEMS RF switch 120n for clarity) includes a control input 122n for receiving a control signal, a first terminal 124n coupled to the second end 118n of the tap 114n, and a switched output 126n selectively coupled to the matching junction 128 in response to the control signal. The circuit 102 further includes a MEMS controllable reactive network 130 coupled to the matching junction 128. The MEMS controllable reactive network 130 includes a first network of shunt capacitors 140 (also referred to as network 140), a network of series inductors 150 (also referred to as network 150), and a second network of shunt capacitors 160 (also referred to as network 160), here arranged in a PI configuration. The first network of shunt capacitors 140 includes a plurality of MEMS RF switches 144a–144n coupled to a corresponding plurality of capacitors 142a–142n. The MEMS RF switches 144a–144n each include a control input 146 (only control input 146a is shown for clarity). The capacitors 142a–142n have first ends coupled to a ground and second ends which are individually, selectively coupled through the MEMS RF switches 144a–144n to the matching junction 128. It will be appreciated by those of ordinary skill in the art that the capacitors 142a–142n can have first ends coupled to the matching junction 128 and second ends which are selectively coupled to ground through the corresponding MEMS RF switches 144a–144n and that the network topology includes but is not limited to a series combination of shunt MEMS switches and capacitors, shunt combinations of series MEMS switches and inductors, shunt connected transformers, and series connected transformers.

The network of series inductors 150 includes a plurality of MEMS RF switches 154a–154n coupled to a corresponding plurality of inductors 152a–152n, here arranged in a shunt configuration. The MEMS RF switches 154a–154n each include a control input 156 (only control input 156a is shown for clarity). The inductor 152a is coupled to the matching junction 128 and inductor 152n is coupled to a load terminal 170. Each of the MEMS RF switches 154a–154n is configured to selectively bypass the respective individual inductor 152a–152n. As noted above, the MEMS switches and corresponding inductors can be alternatively arranged in a shunt configuration.

The second network of shunt capacitors 160 includes a plurality of MEMS RF switches 164a–164n coupled to a corresponding plurality of capacitors 162a–162n. The MEMS RF switches 164a–164n each include a control input 166 (only control input 166a is shown for clarity). The capacitors 162a–162n have first ends coupled to ground and second ends which are individually, selectively coupled through the MEMS RF switches 164a–164n to the load terminal 170. As noted above, the MEMS RF switches 164a–164n can have one connection coupled to ground or selectively coupled to ground instead of the first ends of the capacitors 162a–162n being coupled to ground. As noted above, it will be appreciated by those of ordinary skill in the art that the capacitors 162a–162n can have first ends coupled to the load terminal 170 and second ends which are selectively coupled to ground through the corresponding MEMS RF switches 164a–164n The matching circuit 102 further includes a control circuit 132 adapted to control each of the MEMS RF switches 120, 144, 154, and 164 individually. The control circuit 132 is coupled to control inputs 122, 146, 156 and 156.

The values of the matching components in the networks (140, 150, 160) can be determined analytically using computer modeling to provide an initial estimate. The component values are selected for improving the impedance matching (including harmonic termination) in conjunction with the selected transformer tap over the frequency bands within the expected frequencies of operation. There are many alternative network designs possible which are a function of the parts count limitation and component stress levels.

In one embodiment, the transformer 106 is a commercially available transformer having multiple secondary winding taps. Such transformers are available from several manufacturers that make component level transformers including Mini-Circuits Laboratories, Coilcraft, and M/A-Com. Alternatively, the transformer 106 comprises a transmission line transformer for improved performance at higher frequencies or the transformer 106 comprises a MEMS transformer integrated together with the MEMS RF switches 120 on a monolithic substrate. In this embodiment, the MEMS RF switches 120 are commercially available thermally actuated MEMS microrelays. Such MEMS microrelays are available from several manufacturers including Model DRL-C15001A_P_24D_6A, MEMSCAP USA, formerly JDS Uniphase MEMS.

Figure 1A:
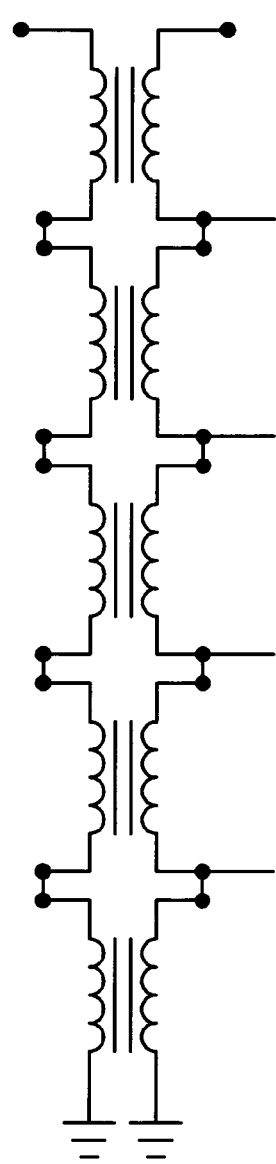
FIG. 1A is a schematic of an alternate affangement of a transformer that can be used in the tuned power amplifier of FIG. 1.

Referring now to FIG. 1A, in an alternate embodiment, multiple transformers having primary windings connected in series and all secondary windings connected in series and tapped as desired for the desired impedance ratios as a function of frequency used in place of the single transformer 106. In this embodiment, different transformers are optimized for different frequency bands.

Figure 1B:
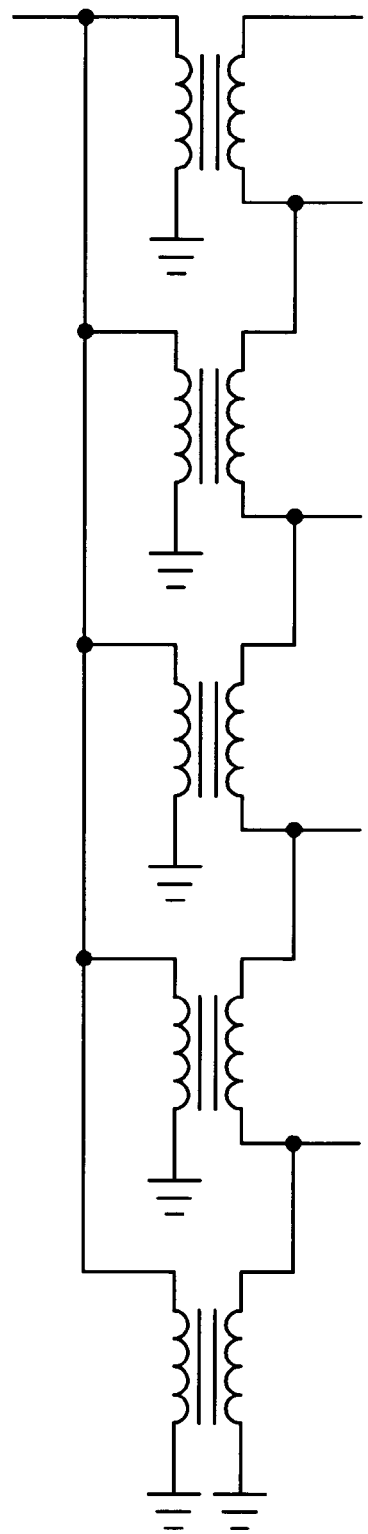
FIG. 1B is a schematic of another alternate arrangement of a transformer that can be used in the tuned power amplifier of FIG. 1.

Referring now to FIG. 1B, another alternative embodiment includes multiple transformers with having primary windings connected in parallel and secondary windings connected in series. In this embodiment, (parallel-series), the parallel primary windings would operate relatively efficiently at extremely low output impedances of the high power active devices while the series secondary windings (tapped as desired) would operate at relatively high impedance levels.

Additionally MEMS switches are coupled to the primaries of the different transformers as part of the frequency band selection mechanism. For example, MEMS switches are arranged to short out selected primaries in the series string of primaries. In an optional embodiment (not shown), MEMS switches are used on the primary side of the transformer in addition to or in place of MEMS switches on the transformer secondary side. For example, the MEMS switches on primary side of the transformer deactivate (i.e., disconnect) various transformer primary circuits (of either a series structure of transformer primaries, or a parallel structure of transformer primaries) when the transmitter operating frequency is outside the specific transformer frequency operating range. The MEMS switches are used in an alternate embodiment to select impedance transformation ratios where the primary circuit of the transformer is at a high impedance level compared to the secondary, to place the MEMS switches where they are subject to reduced operating stress. For example, a high voltage device (e.g., a 48 v silicon carbide MESFET operating at low frequencies (30–88 MHz) and at relatively low output power e.g., ten watts) would require the matching circuitry on the primary side, since this would now be the high impedance (having relatively less stress) side.

Figure 3:
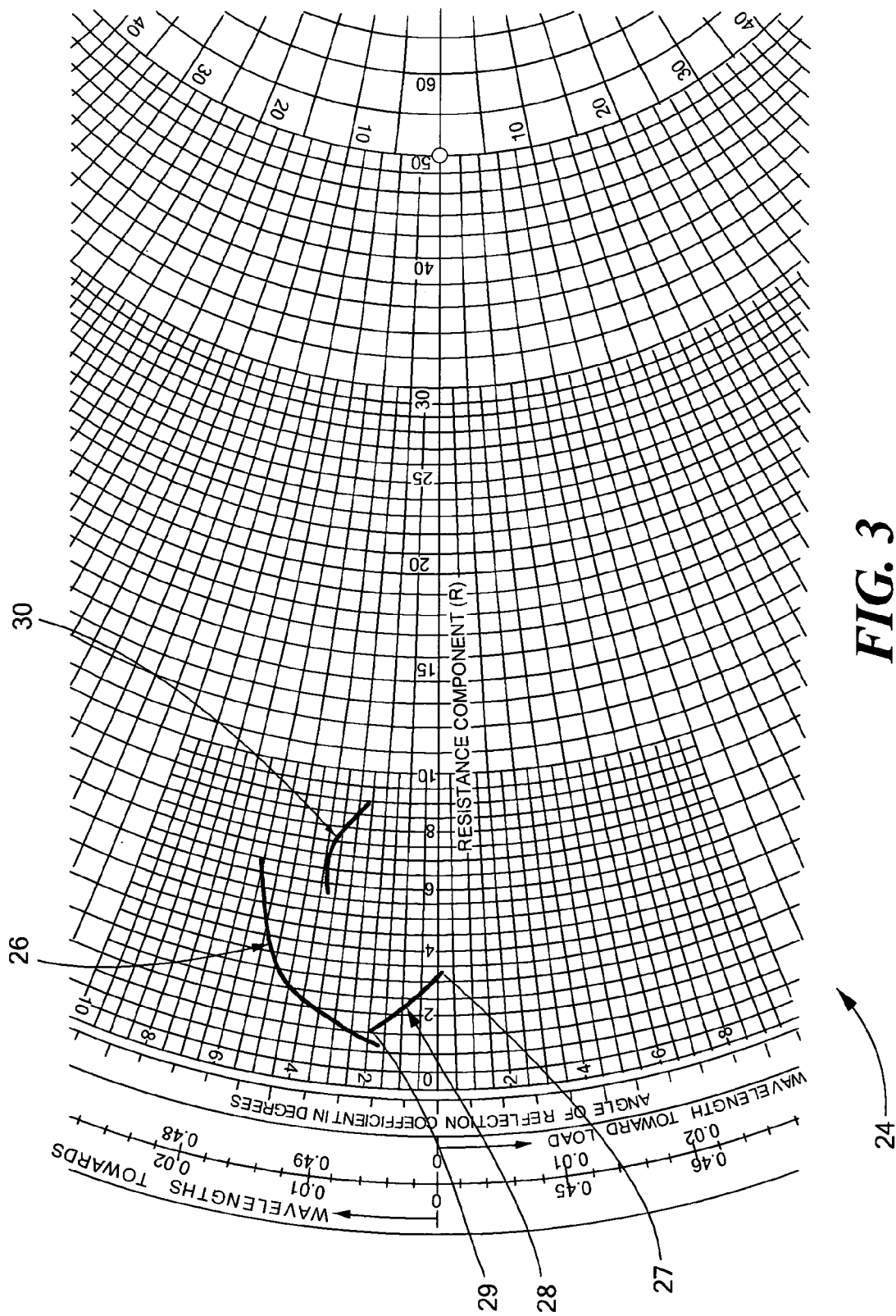
FIG. 3 is a portion of a Smith chart illustrating the load impedance versus frequency for a matching network.

In operation, the matching circuit 102 is used to transform the impedance of a load 172, for example a broadband antenna with a nominal fifty ohm impedance, to maintain efficient performance by providing the nearly optimum load impedance at all frequencies to the active device 104. By selectively controlling the MEMS RF switches 120a–120n, the transformer 106 provides selectable impedance transformation ratios. The transformer 106 is configured as a step-down transformer in relation to the load 172 for operation with typical FET high power active devices. The transformer 106 transforms the load impedance down to the required low impedances required by the characteristics of the active device 104 at high RF output power. The MEMS RF switches 120a–120n associated with the transformer 106 are controlled for selecting the proper impedance transformation ratio. This ratio is determined by the optimum load impedance of the output transistor, and varies over frequency as shown in FIG. 3. At the low end of the operating frequency range (e.g., 30 MHz), the optimum impedance transformation ratio is around 4 (a 2:1 turns ratio in the transformer 106 as shown in FIG. 1). At the high end of the operating frequency range (e.g., 400 MHz), the optimum impedance transformation ratio is approximately 36 (a 6:1 turns ratio). The transformer 106 and the selectable transformation ratio provide a load impedance that is very close to the optimum load impedance. It should be noted that the turns ratios described above is derived from a model using a specific RF device over a specific frequency range at a specific power level, the turns ratios vary depending on the actual device used, the frequency ranges, and the power levels.

By using transformer 106 with a selectable impedance transformation ratios, the load impedance presented to the active device 104 across the desired frequency range is broken into wide segments, and is near to the optimum load impedance for the active device 104 without switching in any additional matching elements in the MEMS controllable reactive network 130. Additional capacitors and inductors in the MEMS controllable reactive network 130 are used as necessary to further optimize the match for best efficiency. MEMS RF switches 120, 144, 154, and 164 are used to select the transformer taps 114 for the proper impedance transformation ratio and to select the proper capacitors and inductors. By placing all of the switching functions on the high impedance side of the transformer 106 (i.e., the load 172 side), the currents flowing through the capacitors and inductors and the MEMS RF switches are significantly reduced, thereby removing stress on these components and eliminating potential points of failures. The wider segments provided by matching circuit 102 reduces the number of times the MEMS RF switches 120, 144, 154, and 164 are cycled between an on state and an off state. The configuration of matching circuit 102 reduces the chances of catastrophic failure due to the reduction in the quantity of MEMS RF switches and the placement of the MEMS RF switches at low stress points (i.e., reduced current) in the circuit and operation at a lower duty cycle (i.e., switching rate) because of the wider frequency segments. It should be noted that the topology of FIG. 1 is configured to prevent catastrophic failure of RF power amplifier 100 as a result of a failure in any one MEM RF switches 120, 144, 154 or 164. Should a switch fail either open or closed, the circuit operation will be degraded, particularly at certain frequencies, but the matching circuit 102 and amplifier 100 still function with reduced efficiency. The failure of any one of MEM RF switches 144, 154, or 164 will render the particular reactive component uncontrollable, but proper operation will still occur for the frequency where the reactive component is in the proper state as if it was still controllable. Operation will be degraded only at frequencies where the uncontrollable component is in the wrong state. Similarly, for MEM RF switches 120, the failure of one switch (open or closed) will still provide correct operation in the frequency band where the failed element is in the correct state, with degraded operation for frequencies where the failed element is in the wrong state. In the case where one of the MEM RF switches 120 fails to close, an alternate MEM RF switch 120 is closed to provide degraded operation. A failed MEM RF switch 120 (e.g., failed in the open state) is detected by the lack of output signal. A closed failure in the MEM RF switch 120 will result in degraded output at some frequencies. It is understood, that the built-in test and monitoring circuits (not shown) in a complete transmitter is used to detect improper operation. Additional decision logic would identify any corrective action the control circuit 132 takes to reduce the amount of degradation at various frequencies.

The combination of the plurality of MEMS RF switches 144a–144n, 164a–164n and corresponding plurality of capacitors 142a–142n, 162a–162n provides MEMS selectable shunt capacitors. The combination of the plurality of MEMS RF switches 154a–154n and corresponding plurality of inductors 152a–152n provides MEMS selectable series inductors. The control circuit 132 controls the state (on/off) of each of the MEMS switches 120, 144, 154 and 164 as a function of the current operating frequency of the matching circuit 102 and amplifier 100.

The fixed value inductors and capacitors in the networks 140, 150 and 160 are selected as required for improved operation of the amplifier 100 by the MEMS RF switches 144, 154, and 164, and provide further optimization of the impedance match. At some operating frequencies, not all of the reactive components in networks 140, 150 and 160 are needed. All of the MEMS RF switches, capacitors, and inductors are on the high impedance side of the transformer 106, having an impedance level, which is approximately equal to the impedance of load 172.

In one embodiment, the current through the network of series inductors 150 is about one amp, with the current calculated by:

power=$I^2R$;

where power=fifty watts; and

R=fifty ohms.

Figure 4:
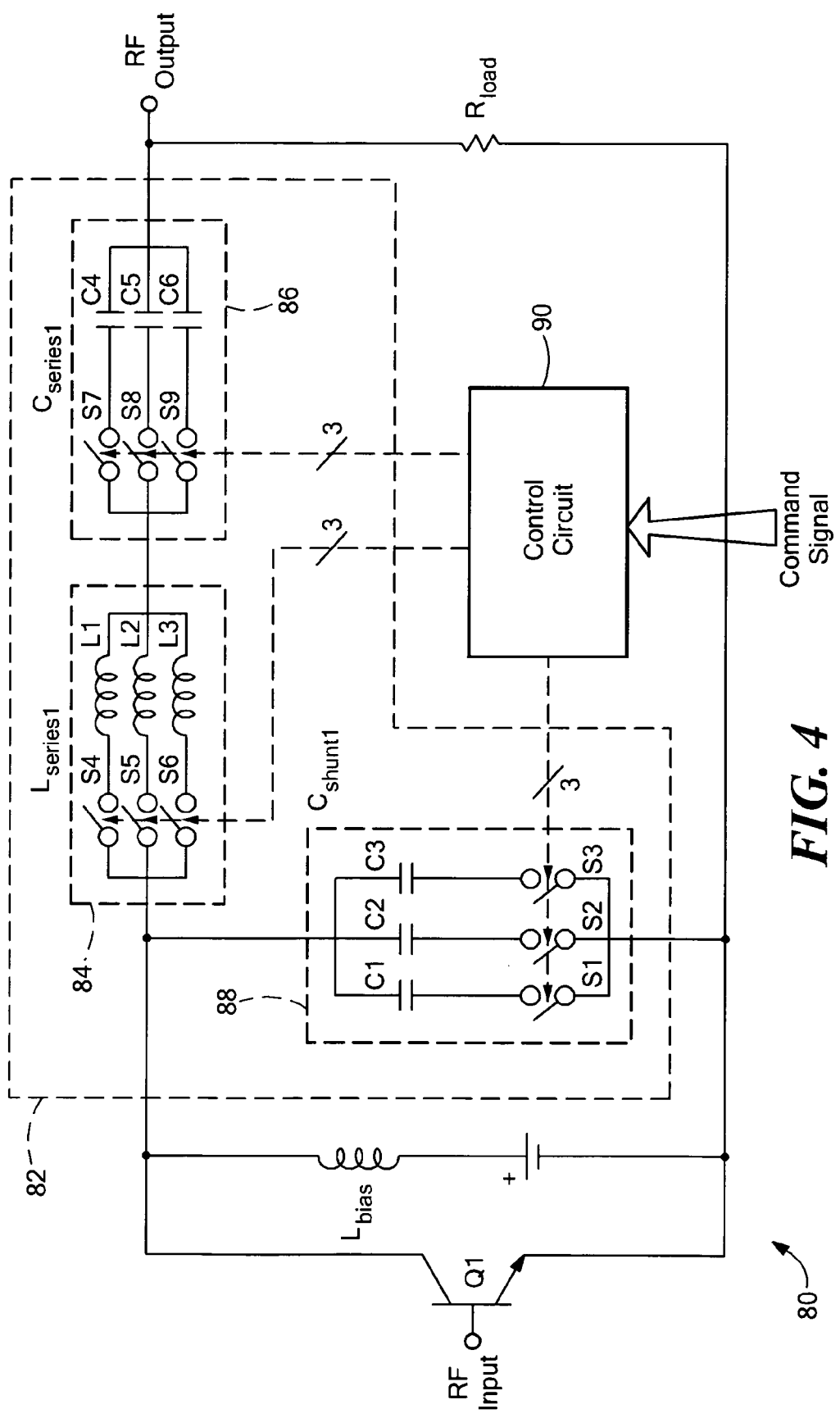
FIG. 4 is a schematic of a prior art MEMS tuned high efficiency amplifier.

The approximately one amp current is about a five-fold decrease from the current in a prior art power amplifier (to be described in conjunction with in FIG. 4). This decrease in current, along with the component Q being less significant at the fifty ohm level, allows standard surface mount chip components to be used without significantly degrading the efficiency of the power amplifier.

Because the transformer 106 is an inherently broadband device, the transformer's 106 gain and efficiency bandwidth is much broader than a network of discrete inductors and capacitor elements. Thus the number of segments (i.e., a portion of the operational frequency range) required to cover a desired frequency range is reduced. For example in one embodiment, a first segment covers 30–100 MHz, a subsequent segment covers 100–225 MHz, and a final segment covers 225–400 MHz.

The MEMS controllable reactive network 130 is implemented using inductors and capacitors in a PI network configuration. It will be appreciated by those of ordinary skill in the art that other configurations for the inductors and capacitors including but not limited to TEE networks, L networks, Lattice networks, combinations of PI and TEE networks or individual MEMS controllable inductors and capacitors. The use of a greater or lesser number of transformer taps 114 and matching values in the MEMS controllable reactive network 130 is possible resulting in a trade-off between efficiency over a frequency span and the ratio of the maximum to minimum frequency of the frequency span.

In one embodiment, the active device 104 is a single ended RF transistor. In alternate embodiments, the active device 104 includes but is not limited to two single-ended transistors, each coupled to the matching circuit 102, and a push-pull transistor configuration. It is understood that the MEMS tuned power amplifier 100 with matching circuit 102 can operate in all of the RF power amplifier classes of operation. Although, FIG. 1 illustrates the matching circuit 102 coupled to the output of the active device 104 or generally coupled to the output stage of the RF power amplifier, the matching circuit 102 can also be coupled to the output stage of a lower level amplifier. The matching circuit 102 can also be coupled to the input of an active device to transform the active devices base or gate impedance to a predetermined impedance level.

In one embodiment, the matching circuit 102 is implemented outside the package of the active device 104 (generally for designs at lower frequencies). Alternatively, the matching circuit 102 is implemented in the same package as the active device 104 (generally for higher frequencies), or a combination of components disposed inside-the-package and outside-the-package can be implemented.

In operation, the control circuit 132 selects one of the transformer taps 114 for a particular frequency band of operation and configures the networks. The selection generally occurs when the active device is not transmitting. The control circuit 132 selects the state of the MEMS RF switches 120, 144, 154, and 164 can be determined by a look up table as a function of the operating frequency or by other known techniques. Generally only one tap 114 is coupled to the matching junction 128, however, it is possible to operate the amplifier 100 with more than one of the transformer taps 114 coupled to the matching junction 128, in which case the output impedance to the load 172 is the combined impedance effect of all the transformer taps 114 which are coupled to the matching junction 128. The output impedance to the load 172 is generally based on the minimum number of secondary turns from ground to the MEM switches 120.

The matching circuit 102 covers a full frequency band segment without any switching of the MEMS RF switches 120, 144, 154, and 164. Thus the life cycle of MEMS RF switches 120, 144, 154, and 164 for fundamental matching and high efficiency is not an issue. The MEMS RF switches 120, 144, 154, and 164 would be switched only when changing to another relatively wide frequency segment, for example, from the 30–88 MHz military hopping band to the 225–400 MHz military hopping band. A new impedance transformation ratio and new inductor and capacitor values in the MEMS controllable reactive network 130 would be selected for broadband operation anywhere in this newly selected segment.

In an alternate embodiment (not shown), the transformer primary winding includes the MEM RF switch selectable taps (referred to as a primary tap system) instead of the secondary winding. In this embodiment, the MEM RF switches would be subject to greater current stress (but less voltage stress) when used for matching the active device to the load. It will be appreciated by those of ordinary skill in the art that the MEMS RF switches 120, 144, 154, and 164 could be replaced by a PIN diode, a GAS FET, or a mechanical switch, for example a conventional "reed" type microrelay.

Figure 2:
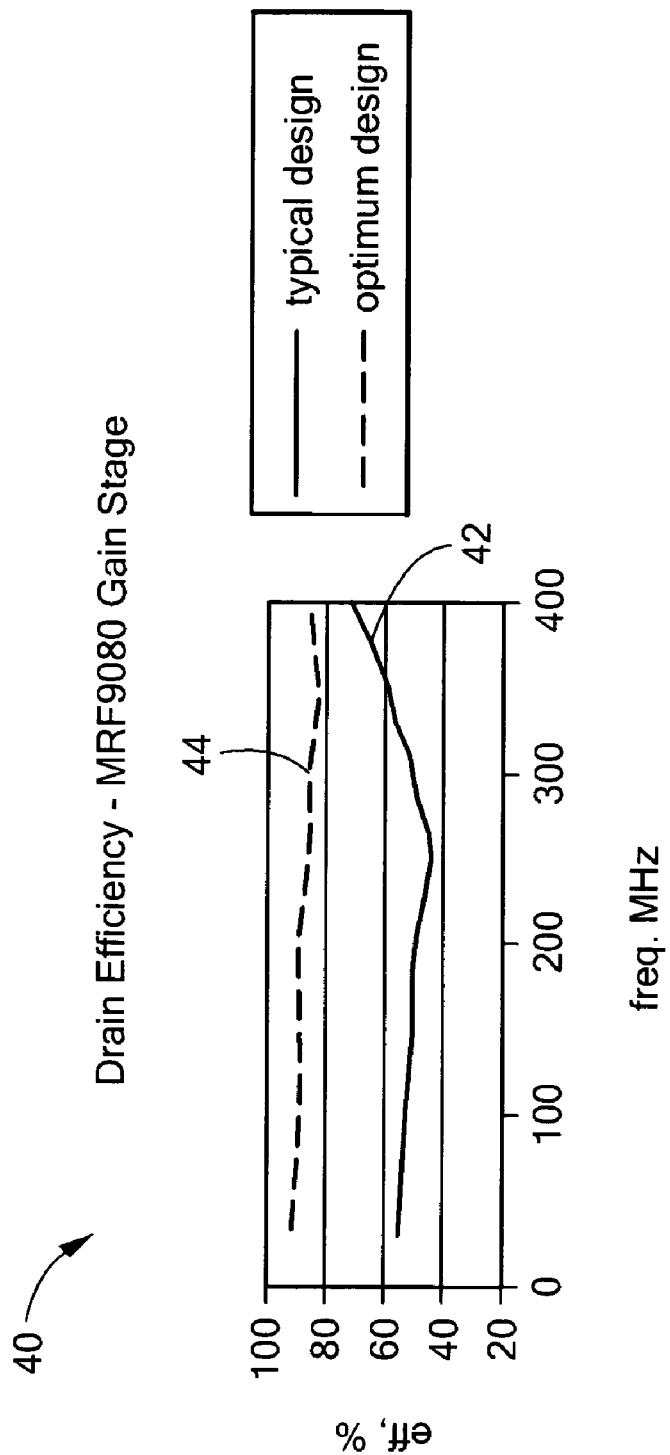
FIG. 2 is a graph illustrating transistor drain efficiency versus frequency for an optimum design compared to a typical design.

FIG. 2 shows a drain efficiency curve 42 (RF output power divided by direct current (DC) input power) showing the drain efficiency of a typical fifty watt power amplifier design using an LDMOS FET output transistor (not shown) operating as a Class AB amplifier. The output transistor is matched from 30–400 MHz using a 4:1 (turns ratio) transformer with an additional series inductor (L)/shunt capacitor (C) network to further optimize the performance at the high end of the frequency band. The drain efficiency 42 averages around 50% at the low end of the frequency range, then gradually increases to around 70% at the high end of the band. The drain efficiency is related to the load impedance presented to the output transistor versus frequency. Curve 44 represents the efficiency resulting from presenting an optimum load impedance to the output transistor at each frequency as contrasted with the conventional design performance curve 42. The drain efficiency curve 44 of the optimum design averages around 85% across the entire frequency range. The optimum design is about twice as efficient as a conventional design over most of the frequency range. The optimum design results in a significant reduction in the amount of power dissipated as waste heat. With the performance improvement cited above, the optimum design dissipates about one-fourth the power compared to the typical design. Thus a power amplifier heat sink would be proportionally smaller in size and lighter in weight for the optimum design.

The optimum design draws about one-half the current from the power supply compared to the typical design. Thus a power supply for the optimum power amplifier design, for example, in a communications base station environment would be about a half to a fourth the size, weight, and generate equivalently less waste heat compared to a typical power amplifier design, depending on the power supply design constraints of current and heat. In a portable station environment, the reduction in current drain for the optimum power amplifier design equates to about twice the battery life when compared to the typical design since battery life is current-based, or a battery with half the capacity could be used for the same amount of transmit time. Because the primary power required for the amplifier is reduced, additional cost savings may be realized in the implementation of the power system.

FIG. 3 shows the optimum load impedance of an amplifier on the low impedance portion of a Smith chart 24. The Smith chart shows there are two optimum load impedances 26 and 30 for the 30–400 MHz range, as the result of the load impedance presented to the device at a second harmonic. In this example, for a fifty watt output LDMOS FET, a transition point occurs at 100 MHz. The optimum fundamental load impedance 30 from 30–100 MHz includes a short at the second harmonic, as the output transistor is best matched with a relatively low impedance (i.e., the short) at the second harmonic for best efficiency. The optimum fundamental load impedance 26 from 100–400 MHz includes an open at the second harmonic, as the output transistor is best matched with a relatively high impedance (i.e., the open circuit) at the second harmonic for better efficiency. Thus the load impedance presented at the second harmonic influences the optimum fundamental load impedance and causes the transition in load impedance at 100 MHz. The load impedances at the third harmonic and above (not shown) have minimal impact to the fundamental load impedance. Note also that the desired load impedance decreases as frequency increases.

A fundamental load impedance 28 presented to the output transistor at a frequency of from 30–400 MHz using the 4:1 (turns ratio) transformer with the additional series L/shunt C network (not shown) is also shown on FIG. 3. The load impedance 28 presented by the typical network includes a first end 27 representing 30 MHz and a second end 29 representing 400 MHz. The load impedance 28 provides a typical design efficiency results as shown by curve 42 in chart 40 of FIG. 2. Note that the optimum and typical load impedances are closest at the high end of the band, indicating that indeed the match was optimized for best efficiency at the high end of the band. The efficiency decreases as frequency decreases because the load impedance presented to the transistor is significantly different than the optimum load impedance for the transistor.

FIG. 4 is a schematic of a prior art tuned amplifier 80 having a matching circuit 82 and a control circuit 90. The matching circuit 82 includes a MEMS switch controllable capacitive shunt network 88 coupled to a MEMS switch controllable inductive series network 84 which is coupled to a capacitive series network 86. In the prior art circuit of FIG. 4, a failure of particular MEMS RF switches results in the power amplifier being useless over most of its frequency range. For example, if C1 of FIG. 4 is the largest capacitor (for use at the lowest frequency) and switch S1 fails so that is stays closed, then the relatively large value C1 is always selected. This would have a significant adverse effect on all performance parameters at the higher frequencies.

Figure 5:
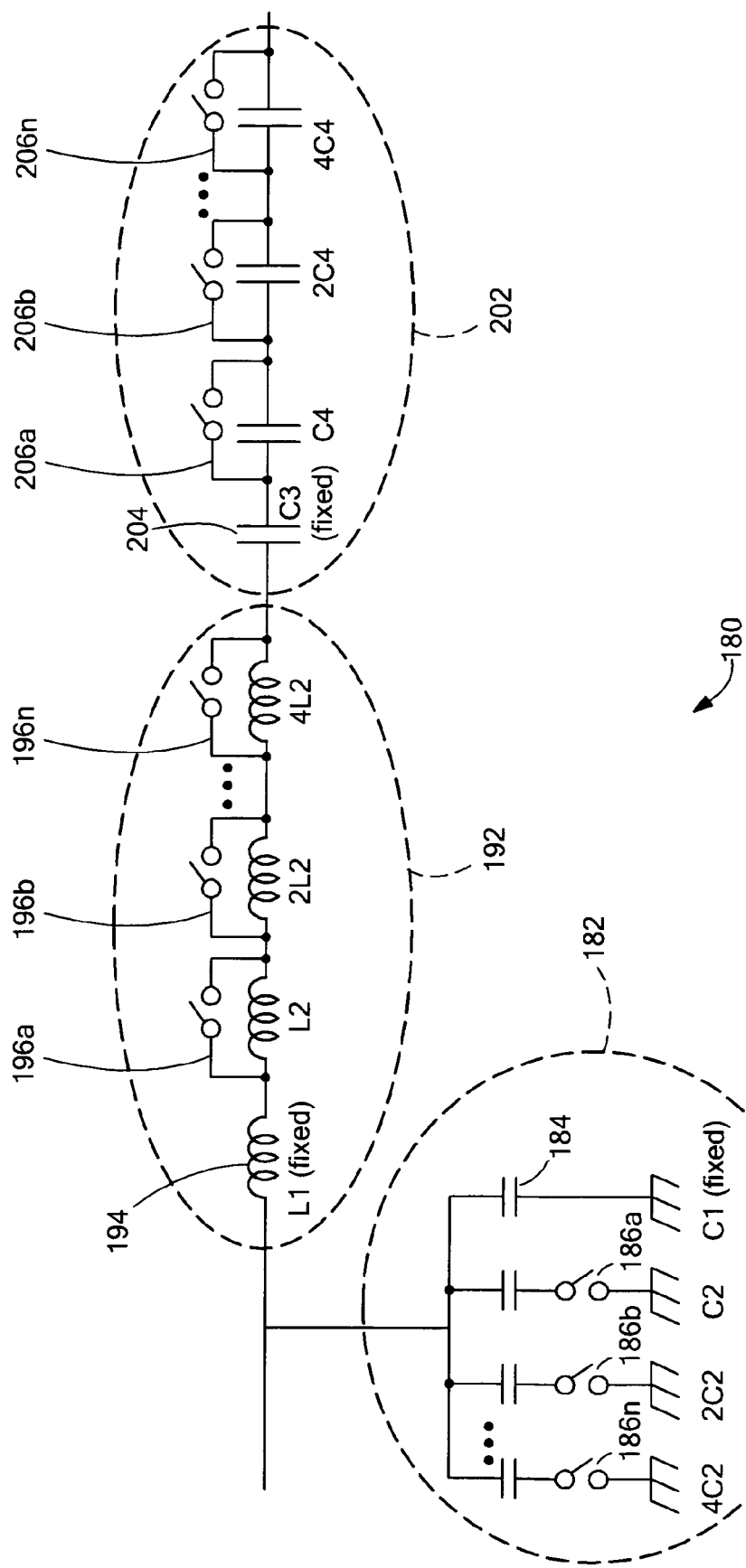
FIG. 5 is a schematic of a binary matching network according to the invention.

Now referring to FIG. 5, an exemplary binary tuning circuit 180 includes a shunt capacitive network 182 coupled to a series inductive network 192 which is coupled to a series capacitive network 202. The shunt capacitive network 182 includes a fixed capacitor 184 having a value C1 and a plurality of MEMS selectable capacitors 186a–186n having values of x*C2, respectively, where x is a power of two. The capacitance of the shunt capacitive network 182 can therefore be selected in incremental values in the range of C1 to C1+C2*($2^n$–1) where n=the next highest power of 2 used for the calculation of the maximum value of x. The series inductive network 192 includes a fixed inductor 194 having a value L1 and a plurality of MEMS selectable inductors 196a–196n having values of x*L2, respectively, where x is a power of two. The inductance of the series inductive network 192 can therefore be selected incremental values to in the range of L1 to L1+L2*($2^n$–1), where n is similarly calculated relative to x. The series capacitive network 202 includes a fixed capacitor 204 having a value C3 and a plurality of MEMS selectable capacitors 206a–206n having values of x*C4, respectively, where x is a power of two. The capacitance of the series capacitive network 202 can therefore be selected incremental values to in the range of C3 to C3+C4*($2^n$–1). It will be appreciated by those of ordinary skill in the art that the binary networks can include combinations of series/shunt networks having corresponding shunt/series MEMS selectable reactive components.

It should be appreciated that an acceptable gain and efficiency bandwidth for nearly optimal efficient operation covers a range of about ±2.5% of the center frequency. In other words, an exemplary matching solution using fixed value components should maintain acceptable gain (less than 3 dB degradation) and efficiency (less than 5% degradation) at frequencies up to 2.5% lower and 2.5% higher than the design center frequency. Thus new matching components need to be selected each time the frequency changes by 5%. For a 30–400 MHz power amplifier, the first design center frequency would be 2.5% above 30 MHz—approximately 31.0 MHz. The next design center frequency would be 5% above 31.0 MHz, and so forth. The number of different tuning solutions needed to nearly optimally cover the 30–400 MHz band in 5% segments would be fifty-three. Implementation of this arrangement in the prior art circuit of FIG. 4 would require fifty-three shunt capacitors (C shunt), fifty-three series inductors (L series), fifty-three series capacitors (C series), and 159 MEMS RF switches, for a total of 318 components. Coverage over two decades of frequency needed for modern military communications products requires even more MEMS RF switches—a 5% bandwidth dictates 95 tuning solutions (a minimum of 570 components for the prior art circuit of FIG. 4 to cover for a 20 MHz to 2 GHz systems.

Capacitors and inductors for high power RF amplifier application are typically surface mount types, and are, for example, cubes approximately one tenth of an inch on a side for the desired fifty watt output power level. The total area of the matching elements for conventional matching networks, assuming relatively dense packing of the components, would be 1.59 square inches (0.1 inches times 0.1 inches times fifty-three times three). This area does not include the 159 MEMS RF switches, nor does it include layout issues with respect to component spacing and routing of all the necessary 159 control lines. It is estimated that least 10 square inches would be needed to accommodate all the components and copper traces on an actual printed wiring board. This 'spreading out' of the layout would introduce significant amounts of stray capacitance and stray inductance into the network, rendering the physical implementation unacceptable at the higher frequencies in the 30–400 MHz range. Using the binary tuning circuit 180 fewer components are required for each of the fifty-three segments.

In one embodiment, capacitors values C2 and C4 and inductor value L2 are chosen to give the minimum step size needed, which normally would be dictated by the change required to go from the highest frequency segment to the next lowest frequency segment (e.g., from 400 MHz to 5% below 400 MHz for the 30–400 MHz power amplifier). The number of binary steps (2*C2, 4*C2, 8*C2, 16*C2, 32*C2, for example) in combination with the fixed value capacitors 184 and 204 and the fixed inductor 194 is dictated by values needed to cover the desired frequency range. In this embodiment which covers the 30–400 MHz range, the number of shunt capacitors, series inductors, and series capacitors is reduced from 159 components to twenty-four components. The number of MEMS RF switches required is reduced from 159 to twenty-one. Thus the total number of components (capacitors, inductors, and MEMS RF switches) is reduced from 318 to forty-three to tune the power amplifier for near optimum efficiency across the 30–400 MHz band. It will be appreciated by those of ordinary skill in the art that the binary tuning circuit 180 can be used in the matching circuit 102 (FIG. 1) in addition to the transformer 106 to reduce the number of required components and MEMS switches.

In a prior art matching circuit at 31 MHz, for a fifty watt, twenty-six volt LDMOS transistor operating in the 30–400 MHz as a Class E power amplifier includes a shunt capacitor having a value of approximately 585.7 pF, a series inductor having a value of approximately 21.1 nH, and a series capacitor having a value of approximately 8127 pF. The current flow in the series leg is approximately 5.15 amps.

For a current of about 5.15 amperes flowing through the series leg of the output network, and assuming the 21.1 nH inductor is a chip inductor with Q=fifty (a typical value per vendor data sheets), the power lost in the resistance of the 21.1 nH chip inductor is 2.1 w. If the LDMOS transistor has a drain efficiency of 90% (from FIG. 2), the overall power amplifier efficiency would be reduced to 86% due to this specific component loss. It is also likely that the chip inductor would fail with this much current going through it. The chip capacitors should not have a problem with heat generation as their Q is typically around several hundred, but handling the high current may still be a problem due to current density restrictions within chip capacitors.

To resolve the excessive loss and current handling problem in the inductor, a physically larger inductor is needed. To resolve the current handling problem in the capacitor, paralleled capacitors is a possible solution. Thus the area reduction gained by implementing a binary tuning technique is lost by the necessity for larger inductors and more capacitors.

Figure 6:
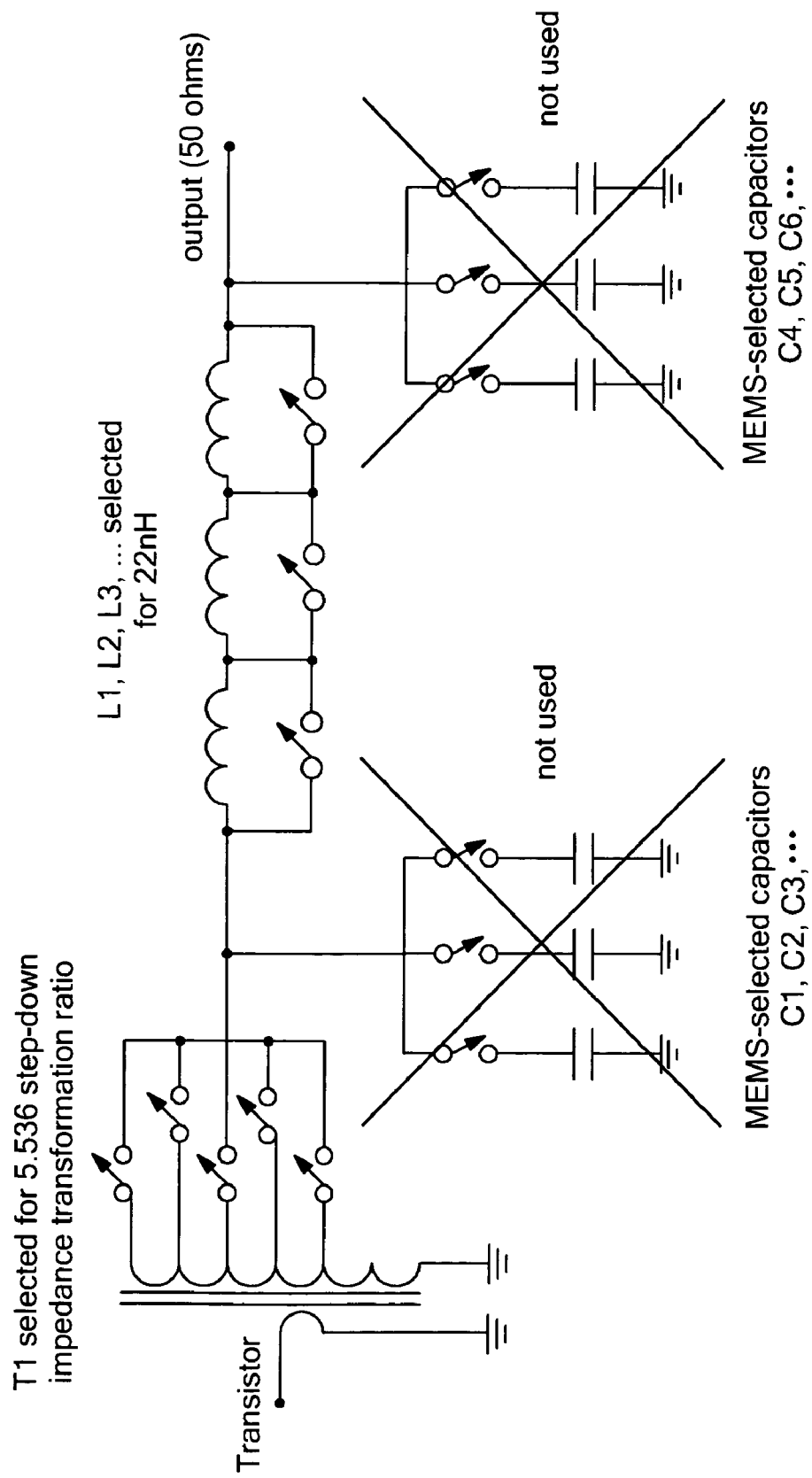
FIG. 6 is a schematic of tuned power amplifier having a matching circuit for a 30–100 MHz frequency range without MEMS selectable shunt capacitors according to the invention.

Now referring to FIG. 6, an exemplary matching circuit 102' for a restricted bandwidth segment, here the 30–100 MHz segment, includes similar components as in circuit 100 of FIG. 1. However, in matching circuit 102' the shunt capacitors are not used in order to reduce the number of components. In this example the matching circuit 102' selects the tap 114n to provide a 5.536 step-down impedance transformation ratio. The matching circuit 102' generally selects the lowest matching ratio at the lowest frequency. The inductors in network 150 are selected to provide an inductance of 22 nH.

Figure 7:
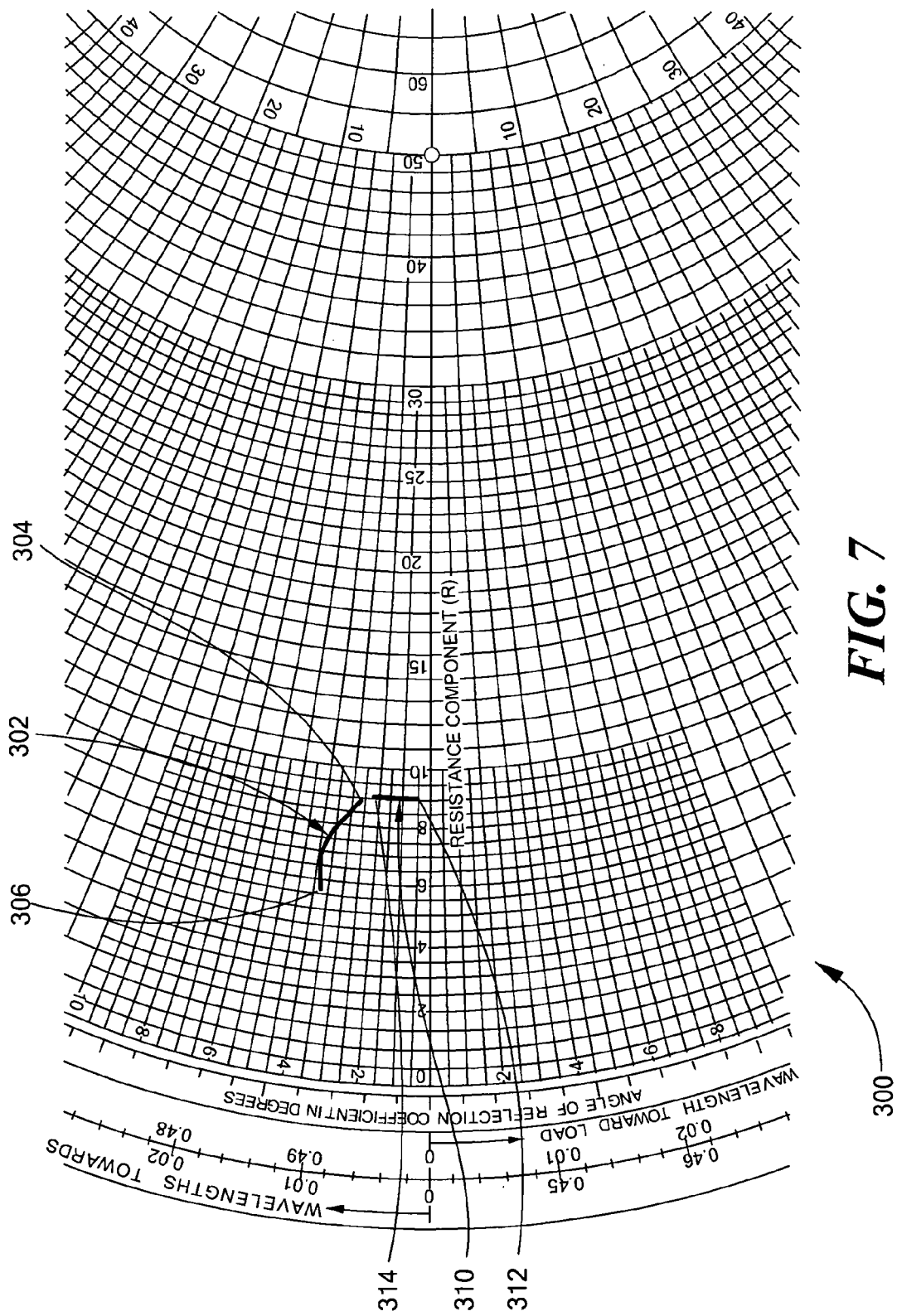
FIG. 7 is a portion of a Smith chart illustrating the load impedance improvement according to the invention compared to a prior art tuned power amplifier.

FIG. 7 shows the output match of the exemplary circuit 102' of FIG. 6 on a Smith chart 300 over the 30–100 MHz segment. A load impedance 310 presented by the matching circuit 102' includes impedance 312 at 30 MHz and impedance 314 at 100 MHz. For reference, the optimum load impedance 302 curve for the 30–100 MHz segment is shown (equivalent to curve as 30 of FIG. 3). The load impedance 310 with second harmonic shorts is presented to the active device 104 by the matching circuit 102. The load impedance 310 is different from the optimum load impedance curve 302 because the second harmonic impedance of the matching circuit 102 is not a perfect short, which is required by the optimum design. Additional tuned components could be used to improve the second harmonic load impedance of load impedance 310 and improve the efficiency so that it is closer to the optimum impedance 302

Figure 8:
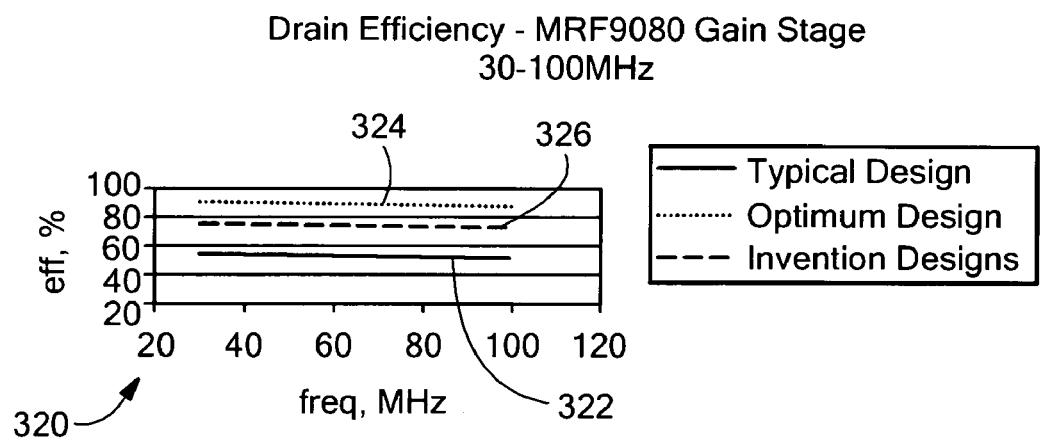
FIG. 8 is a graph illustrating transistor drain efficiency versus frequency according to the invention in the 30–100 MHz band compared to an optimum design and a typical design.

Now referring to FIG. 8, graph 320 shows the drain efficiency over the 30–100 MHz segment using the matching circuit 102' (FIG. 6) represented by curve 326 corresponding to curve 310 of FIG. 7. Curve 322 represents the efficiency of a prior art fifty watt power amplifier design using an LDMOS FET output transistor (not shown) operating in Class AB and curve 324 represents the efficiency of an optimal matching circuit corresponding to curve 302 of FIG. 7. As indicated, the amplifier operates at a high output power level with efficiencies significantly greater than typical prior art performance, for example, in the 30–88 MHz military hopping band.

The load impedance at the second harmonic has a significant effect on efficiency. Computer modeling using RF simulation software indicates that the extremely high efficiencies seen in the optimum design curve of FIG. 2 are achieved only when the impedance at the second harmonic is near optimum (i.e., a very low impedance from 30–100 MHz and a very high impedance above 100 MHz). For the 30–100 MHz range, presenting a very low impedance over two octaves negates any attempt to have a broadband solution to address the aforementioned frequency hopping and MEMS switch life cycle limitations. For the 100–400 MHz range, presenting relatively high impedance at the second harmonic is difficult because of the impedance at the second harmonic presented by the fundamental match is not guaranteed to have high impedance. The implication of not being able to implement the proper second harmonic termination is twofold: the fundamental load impedance required by the transistor will be different than the theoretical fundamental load impedance and the efficiency will not be as high as the theoretical efficiency. This is due to less than optimum second harmonic impedance presented to the output transistor.

It will be appreciated that additional components and MEMS switches can be added to handle harmonic currents by providing harmonic terminations. Broadband operation for reduced MEM switching activity requires a trade-off between optimum matching (at fundamental and harmonic frequencies) and nearly-optimum matching (at the fundamental frequency only). It should be noted that an active device with different fundamental and harmonic load requirements might achieve performance closer to optimum efficiency. It is possible to provide the desired harmonic loading for some narrow region of frequencies.

Figure 9:
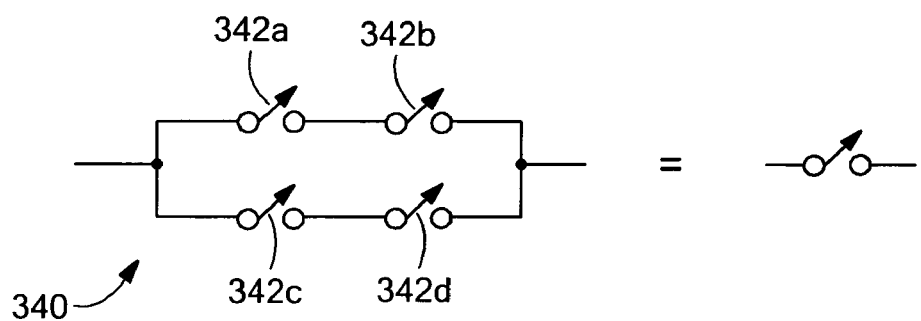
FIG. 9 is a schematic of a configuration for reducing single point failures in a tuned power amplifier according to the invention.

Now referring to FIG. 9, a redundant MEMS switch 340 includes a plurality of MEMS switches 342a–342d arranged in a series-shunt configuration. For clarity the individual control inputs are not shown. By incorporating the redundant MEMS switch 340 in the matching circuit 102 (FIG. 1), the effect of a failure of a single MEMS switch can be minimized to prevent potentially degraded performance if a failure occurs in a single MEM switch. Here, at least two MEMS switches must fail to cause a switching failure.

It should be appreciated that in addition to matching the impedance of an output load to an active device, the inventive matching circuit can similarly match the impedance of an antenna to nominal fifty ohms (for use as an antenna matching network) and can match the input impedance of an active device to the output impedance of a preceding active device.

All publications and references cited herein are expressly incorporated herein by reference in their entirety.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims.

What is claimed is:

1. A circuit for matching the impedance of an output load to an active device comprising:
   a transformer comprising:
      a first winding having a terminal for coupling to the output of the active device;
      a second winding electromagnetically coupled to the first winding; and
      a plurality of taps, each of the plurality of taps having a first end, coupled to a position disposed on the second winding corresponding to a ratio of the second winding to first winding differing from other ones of the plurality of taps, and a second end;
   a plurality of MEMS switches each having a control input for receiving a corresponding control signal, a first terminal coupled to the second end of a corresponding one of the plurality of taps, and a switched output selectively coupled to a matching junction in response to the corresponding control signal; and
   a MEMS controllable reactive network coupled to the matching junction.

2. The circuit of claim 1 wherein the output load comprises a narrowband antenna.

3. The circuit of claim 1 wherein the output load comprises a broadband antenna.

4. The circuit of claim 1 wherein the transformer comprises a transmission line transformer.

5. The circuit of claim 1 wherein the transformer comprises a plurality of transformers each having a primary winding and a secondary winding and wherein each of the primary windings is connected in series and each of the secondary windings is connected in series.

6. The circuit of claim 1 wherein the transformer comprises a plurality of transformers each having a primary winding and a secondary winding and wherein each of the primary windings is connected in parallel and each of the secondary windings is connected in series.

7. The circuit of claim 1 wherein the at least one of the plurality of MEMS switches comprises a plurality of MEMS switches arranged in a redundant series/shunt configuration.

8. The circuit of claim 1 wherein the MEMS controllable reactive network comprises at least one of:
   a PI network;
   a TEE network;
   an L network;
   a Lattice network; and
   a PI-TEE-PI-TEE network.

9. The circuit of claim 1 wherein the MEMS controllable reactive network comprises:
   a first plurality of MEMS selectable shunt capacitors coupled to the matching junction;
   a plurality of MEMS selectable series inductors coupled in series and having a first end coupled to the matching junction and a second end for coupling to a load terminal; and
   a second plurality of MEMS selectable shunt capacitors coupled to the second end of the plurality of MEMS selectable series inductors.

10. The circuit of claim 1 wherein the MEMS controllable reactive network comprises a plurality of binary networks of MEMS selectable reactive devices.

11. The circuit of claim 1 wherein the transformer comprises a MEMS transformer.

12. The circuit of claim 11 wherein the MEMS transformer and the plurality of MEMS switches are provided in a monolithic substrate.

13. The circuit of claim 1 wherein the output load comprises an input of a transistor and wherein the circuit transforms the transistor's input impedance to a predetermined impedance.

14. The circuit of claim 13 wherein the transistor is at least one of:
   a bipolar junction transistor;
   a silicon metal oxide semiconductor field effect transistor;
   a laterally diffused metal oxide semiconductor field effect transistor;
   a gallium arsenide metal semiconductor field effect transistor;
   a silicon carbide MESFET; and
   a field effect transistor.

15. The circuit of claim 13 wherein the predetermined impedance is approximately fifty ohms.

16. An amplifier comprising:
   an active device having an input for receiving an RF signal and an output;
   a transformer having a first winding coupled to the output of the active device, and a second winding;
   at least one tap having a first end coupled to the secondary winding and a second end; and
   at least one MEMS switch having a control input for receiving a control signal, a switch input coupled to the second end of the at least one tap, and a switched output selectively coupled to a matching junction in response to the control signal; and
   a MEMS controllable reactive network coupled to the matching junction.

17. An amplifier comprising:
   an active device having an input for receiving an RF signal and an output;
   a transformer having a first winding coupled to the active device output, and a second winding;
   a plurality of transformer taps each having a first end coupled to the second winding and each corresponding to a different ratio of the second winding to first winding;
   a plurality of MEMS switches each coupled between a corresponding one of the plurality of transformer taps and a matching junction, and each of the plurality of MEMS switches having a control input for receiving a corresponding control signal for changing the impedance of the transformer in response to the control signal; and
   a MEMS controllable reactive network coupled to the matching junction.

18. The amplifier of claim 17 wherein the amplifier class of operation is one of class A to class F.

19. The amplifier of claim 17 further wherein the active device comprises at least one of:
   a single ended transistor;
   two single-ended transistors; and
   a push-pull transistor configuration.

20. The amplifier of claim 17 wherein the transformer and MEMS switches are provided in a monolithic substrate.

21. The amplifier of claim 17, wherein the MEMS controllable matching network comprises:
- a first plurality of MEMS selectable shunt capacitors coupled to the matching junction;
- a plurality of MEMS selectable series inductors coupled in series and having a first end coupled to the matching junction and a second end for coupling to a load; and
- a second plurality of MEMS selectable shunt capacitors coupled to the second end of the plurality of MEMS selectable series inductors.

22. The amplifier of claim 21 wherein the active device and the MEMS controllable reactive network are provided in a monolithic substrate.

23. The amplifier of claim 21 wherein the MEMS controllable reactive network comprises a plurality of binary networks of MEMS selectable reactive devices.

* * * * *

UNITED STATES PATENT AND TRADEMARK OFFICE
CERTIFICATE OF CORRECTION

PATENT NO. : 6,992,543 B2
APPLICATION NO. : 10/302482
DATED : January 31, 2006
INVENTOR(S) : Roland C. Luetzelschwab et al.

It is certified that error appears in the above-identified patent and that said Letters Patent is hereby corrected as shown below:

Column 3, line 7 delete "RF transistor" and replace with --RF transistors--.

Column 3, line 62 delete "affangement" and replace with --arrangement--.

Column 6, line 29 delete "164a-164n" and replace with --164a-164n.--.

Column 7, line 15 delete "on primary side" and replace with --on the primary side--.

Column 7, line 63 delete "ratios," and replace with --ratio,--.

Columns 9-10, lines 67-1 delete "selects the state of the MEMS RF switches 120, 144, 154, and 164 can be determined" and replace with --selects the state of the MEMS RF switches 120, 144, 154, and 164, which can be determined--.

Column 10, lines 28-29 delete "MEM RF switches" and replace with --MEMS RF switches--.

Column 11, line 58 delete "is stays closed," and replace with --it stays closed,--.

Column 12, lines 56-57 delete "that least" and replace with --that at least--.

Column 13, line 65 delete "curve as 30" and replace with --curve 30--.

Column 16, line 34 delete "and a second end; and" and replace with --and having a second end; and--.

UNITED STATES PATENT AND TRADEMARK OFFICE
CERTIFICATE OF CORRECTION

PATENT NO. : 6,992,543 B2
APPLICATION NO. : 10/302482
DATED : January 31, 2006
INVENTOR(S) : Roland C. Luetzelschwab et al.

It is certified that error appears in the above-identified patent and that said Letters Patent is hereby corrected as shown below:

Column 16, line 63 delete "a single ended transistor;" and replace with --a single-ended transistor;--.

Signed and Sealed this

Eighteenth Day of July, 2006

JON W. DUDAS
*Director of the United States Patent and Trademark Office*